(12) United States Patent
McElheny

(10) Patent No.: US 7,107,566 B1
(45) Date of Patent: Sep. 12, 2006

(54) PROGRAMMABLE LOGIC DEVICE DESIGN TOOLS WITH GATE LEAKAGE REDUCTION CAPABILITIES

(75) Inventor: Peter John McElheny, Morgan Hill, CA (US)

(73) Assignee: Altera Corporation, San Jose, CA (US)

(*) Notice: Subject to any disclaimer, the term of this patent is extended or adjusted under 35 U.S.C. 154(b) by 282 days.

(21) Appl. No.: 10/763,733

(22) Filed: Jan. 22, 2004

(51) Int. Cl.
*G06F 17/50* (2006.01)
*G06F 9/44* (2006.01)

(52) U.S. Cl. .................. 716/16; 716/18; 716/2; 716/7

(58) Field of Classification Search .......... 716/16, 716/18, 2, 7
See application file for complete search history.

(56) References Cited

U.S. PATENT DOCUMENTS

| | | | | |
|---|---|---|---|---|
| 5,508,939 A | * | 4/1996 | Kim et al. ................ | 716/7 |
| 5,576,636 A | * | 11/1996 | Baucom ................. | 326/39 |
| 5,694,055 A | * | 12/1997 | Shimanek .............. | 326/37 |
| 5,712,790 A | * | 1/1998 | Ditlow et al. ........... | 716/2 |
| 5,949,689 A | * | 9/1999 | Olson et al. ............ | 703/14 |
| 6,038,386 A | * | 3/2000 | Jain ..................... | 716/16 |
| 6,075,932 A | * | 6/2000 | Khouja et al. .......... | 716/4 |
| 6,195,630 B1 | * | 2/2001 | Mauskar et al. ........ | 703/18 |
| 6,230,303 B1 | * | 5/2001 | Dave ................... | 716/7 |
| 6,289,488 B1 | * | 9/2001 | Dave et al. ............. | 716/1 |
| 6,324,678 B1 | * | 11/2001 | Dangelo et al. ........ | 716/18 |
| 6,345,379 B1 | * | 2/2002 | Khouja et al. .......... | 716/4 |
| 6,480,815 B1 | * | 11/2002 | Olson et al. ............ | 703/14 |
| 6,562,638 B1 | * | 5/2003 | Balasinski et al. ...... | 438/14 |
| 6,681,376 B1 | * | 1/2004 | Balasinski et al. ...... | 716/4 |
| 6,768,338 B1 | * | 7/2004 | Young et al. ........... | 326/44 |
| 6,777,978 B1 | * | 8/2004 | Hart et al. ............. | 326/38 |
| 6,868,014 B1 | * | 3/2005 | Melik-Martirosian et al. ................. | 365/185.28 |
| 6,871,172 B1 | * | 3/2005 | Sanders ................ | 703/14 |
| 6,993,737 B1 | * | 1/2006 | Anderson et al. ....... | 716/5 |
| 2003/0208733 A1 | * | 11/2003 | Sokolov ................ | 716/4 |
| 2004/0025135 A1 | * | 2/2004 | Hart et al. ............. | 716/16 |
| 2004/0216074 A1 | * | 10/2004 | Hart et al. ............. | 716/16 |

(Continued)

FOREIGN PATENT DOCUMENTS

EP   416903 A2 *   3/1991

(Continued)

OTHER PUBLICATIONS

NN8803247, "Power Reduction Method for Static CMOS Programmable Logic Arrays (Plas)", IBM Technical Disclosure Bulletin, vol. 30, No. 10, Mar. 1988, pp. 247-248 (pages ).*

(Continued)

*Primary Examiner*—Phallaka Kik
(74) *Attorney, Agent, or Firm*—G. Victor Treyz

(57) ABSTRACT

Power consumption on programmable logic devices can be minimized by taking account of gate leakage effects. A logic design system may analyze a logic design to determine which signals are most often high and which signals are low. A logic designer may also provide information on signals to the logic design system. The logic design system may include a gate leakage optimizer and other computer-aided design tools to produce configuration data for programmable logic devices. The programmable logic device may have logic gates formed from stacks of transistors. The configuration data may be used to configure the programmable logic devices so that signals that are usually high are routed to transistors that are high in the stacks, thereby reducing gate leakage and power consumption while maintaining satisfactory performance for the device.

10 Claims, 9 Drawing Sheets

| ROW | S1 | S2 | S3 | T1 | T2 | T3 |
|---|---|---|---|---|---|---|
| 1 | 0 | 0 | 0 | 0 | 0 | 0 |
| 2 | 0 | 0 | 1 | 0 | 0 | LOW |
| 3 | 0 | 1 | 0 | 0 | HIGH | 0 |
| 4 | 0 | 1 | 1 | 0 | LOW | LOW |
| 5 | 1 | 0 | 0 | HIGH | 0 | 0 |
| 6 | 1 | 0 | 1 | HIGH | 0 | LOW |
| 7 | 1 | 1 | 0 | HIGH | HIGH | 0 |
| 8 | 1 | 1 | 1 | HIGH | HIGH | HIGH |

U.S. PATENT DOCUMENTS

| | | | |
|---|---|---|---|
| 2004/0250231 A1* | 12/2004 | Killian et al. | 716/18 |
| 2005/0071800 A1* | 3/2005 | Liu | 716/18 |
| 2005/0091629 A1* | 4/2005 | Eisenstadt et al. | 716/13 |
| 2005/0097496 A1* | 5/2005 | Koike et al. | 716/13 |
| 2005/0198606 A1* | 9/2005 | Gupta et al. | 716/18 |
| 2006/0095872 A1* | 5/2006 | McElvain et al. | 716/1 |

FOREIGN PATENT DOCUMENTS

| | | |
|---|---|---|
| EP | 667679 A1 * | 8/1995 |

OTHER PUBLICATIONS

NN940169, "Asymmetric Transition Dual-Rail Signalling", IBM Technical Disclosure Bulletin, vol. 37, No. 1, Jan. 1994, pp. 69-84 (pages).*

NN9603163, "Programmable Logic Array Worst Case Negative-OR Procedure", IBM Technical Disclosure Bulletin, vol. 39, No. 3, Mar. 1996, pp. 163-164 (pages).*

Landers et al., "A Multiplexer-Based Architecture for High-Density, Low-Power Gate Arrays", IEEE Journal of Solid-State Circuits, vol. 30, No. 4, Apr. 1995, pp. 392-396.*

Roy, "Power-Dissipation Driven FPGA Place and Route Under Timing Constraints", IEEE Transactions on Circuits and Systems—I: Fundamental Theory and Applications, vol. 46, No. 5, May 1999, pp. 634-637.*

Rahman et al., "Wiring Requirement and Three-Dimensional Integration Technology for Field Programmable Gate Arrays", IEEE Transactions on Very Large Scale Integration (VLSI) Systems, vol. 11, No. 1, Feb. 2003, pp. 44-54.*

Goda et al., "SiGe HBT BiCMOS FPGAs for fast reconfigurable computing", IEE Proceddings of Computers and Digital Techniques, vol. 147, No. 3, May 2000, pp. 189-194.*

Marik et al., "Energy-aware logic synthesis and technology mapping for MUX-based FPGAs", Proceedings of 17th International Conference on VLSI Design, Jan. 20004, pp. 73-78.*

Tseng et al., "A power driven two-level logic optimizer", Proceedings of the ASP-DAC Asia and South Pacific Design Automation Conference, Jan. 28, 1997, pp. 28-31.*

Shang et al., "High-level power modeling of CPLDs and FPGAs", 2001 International Conference on Computer Design, Sep. 23, 2001, pp. 46-51.*

Anderson et al., "Power-aware technology mapping for LUT-based FPGAs", 2002 IEEE International Conference on Field-Programmable Technology, Dec. 16, 2002, pp. 211-218.*

Tuan et al., "Leakage Power Analysis of a 90nm FPGA", Proceedings of the IEEE 2003 Custom Integrated Circuits Conference, Sep. 21, 2003, pp. 57-60.*

Calhoun et al., "Design Methodology for fine-grained leakage control in MTCMOS", Proceedings of the 2003 International Symposium on Low Power Electronics and Design, Aug. 25, 2003, pp. 104-109.*

Rafik S. Guindi et al., "Design Techniques for Gate-Leakage Reduction in CMOS Circuits," 2003 IEEE pp. 61-65, Mar. 24, 2003.

Vijaykrishnan Narayanan, "Managing Leakage: From Circuits to Software" http://www.cse.psu.edu/~mdl, Comp. Architecture Seminar, UT Austin Feb. 18, 2002, pp. 1-68.

"Part II Leakage Reduction Techniques", ICCAD 2002 Tutorial; pp. 1-50.

Afshin Abdollahi et al., "Runtime Mechanisms for Leakage Current Reduction in CMOS VSLI Circuits", ISLPED' 02, Aug. 12-14, 2002, pp. 1-6.

James Kao et al. "Transistor Sizing Issues and Tool for Multi-Threshold CMOS Technology," DAC 97, Anaheim, CA (c) 1997, pp. 1-6.

Mohab Anis et al., "Dynamic and Leakage Power Reduction in MTCMOS Circuits Using an Automated Efficient Gate Clustering Technique" (undated), pp. 1-27.

B. Nikolic, "Advanced Digital Circuits" EE241 Lecture Notes, Spring 2002, pp. 1-16.

Fei Li et al. "Maximum Current Estimation Considering Power Gating" http://eda.ece.wisc.edu (undated), pp. 1-16, University of Wisconsin-Madison.

* cited by examiner

| ROW | S1 | S2 | S3 | T1 | T2 | T3 |
|---|---|---|---|---|---|---|
| 1 | 0 | 0 | 0 | 0 | 0 | 0 |
| 2 | 0 | 0 | 1 | 0 | 0 | LOW |
| 3 | 0 | 1 | 0 | 0 | HIGH | 0 |
| 4 | 0 | 1 | 1 | 0 | LOW | LOW |
| 5 | 1 | 0 | 0 | HIGH | 0 | 0 |
| 6 | 1 | 0 | 1 | HIGH | 0 | LOW |
| 7 | 1 | 1 | 0 | HIGH | HIGH | 0 |
| 8 | 1 | 1 | 1 | HIGH | HIGH | HIGH |
FIG. 7
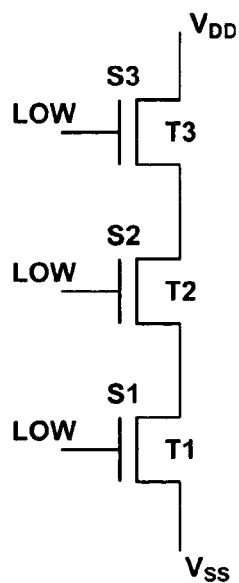
FIG. 8
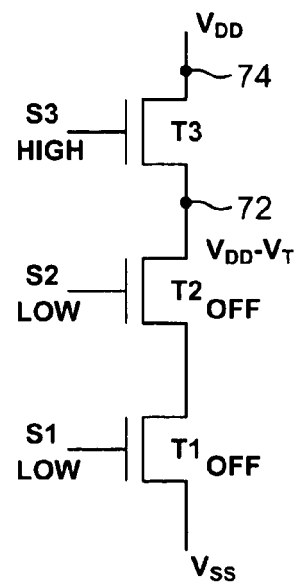
FIG. 9
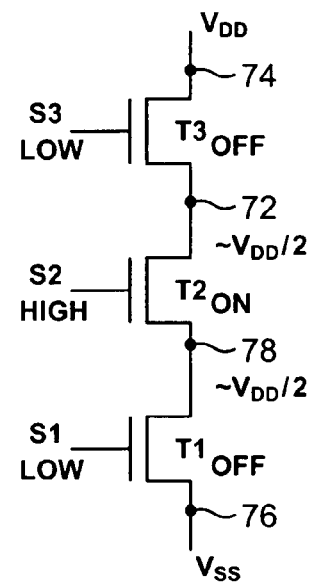
FIG. 10

PROGRAMMABLE LOGIC DEVICE DESIGN TOOLS WITH GATE LEAKAGE REDUCTION CAPABILITIES

BACKGROUND OF THE INVENTION

This invention relates to logic design systems for programmable logic devices, and more particularly to systems and methods for configuring programmable logic to minimize leakage current.

Programmable logic devices are a type of integrated circuit that can be programmed by a user to implement a desired logic design. In a typical scenario, a logic designer uses a logic design system to design a logic circuit. The logic design system uses information on the hardware capabilities of a given programmable logic device to help the designer implement the logic circuit using the resources available on that given programmable logic device.

As semiconductor fabrication methods improve, it is becoming possible to fabricate transistors and other integrated circuit components with increasingly small dimensions. It is generally desirable to shrink component sizes as much as possible to reduce costs and improve performance. However, as transistor gates become smaller, they become less effective at turning transistors off. This can lead to undesirable gate leakage effects that increase the power consumption of an integrated circuit.

Hardware-based approaches can help reduce gate leakage. However, hardware-based approaches can result in an increase in circuit overhead and complexity.

It would therefore be desirable to provide improved ways in which to reduce power consumption due to gate leakage effects in programmable logic devices.

SUMMARY OF THE INVENTION

In accordance with the present invention, programmable logic device design systems are provided that can reduce power consumption by taking account of gate leakage effects during the design phase.

Programmable logic devices contain logic gates. The logic gates and other resources on a programmable logic device can be configured by a logic designer so that the programmable logic device performs custom logic functions.

A logic design system containing computer-aided design (CAD) tools may be used by the logic designer to produce configuration data for a programmable logic device. When the programmable logic device is programmed using the configuration data, the resources of the programmable logic device perform the custom logic functions specified by the logic designer.

The logic gates of a programmable logic device are formed from transistors. Each transistor has a control terminal called a gate and source and drain terminals. When a high logic signal is applied to a transistor gate while the source and drain terminals have lower voltages, a gate leakage current develops across the gate. The gate leakage current gives rise to an undesirable power dissipation by the logic gate.

Transistors in logic gates are arranged in stacks. Transistors that are higher in the stack (i.e., transistors nearer the positive supply voltage in an n-channel metal-oxide-semiconductor transistor stack) are less likely to experience high gate leakage currents when high signals are applied to their gates than transistors that are lower in the stack. Accordingly, the transistors that are higher in the stack are better able to handle signals that are likely to be high than transistors that are lower in the stack.

This "stacking effect" makes gate leakage power consumption dependent on where the signals that are likely to be high are routed. If signals that are most likely to be high (e.g., signals that are likely to be high because they are expected to be high more than 50% of the time or signals that are otherwise known or expected to be high the most) are routed to the transistors that are high in the stack, the overall gate leakage of the logic gate stack will be relatively low.

The logic design system can produce configuration data that reduces power consumption by taking the stacking effect into account. The configuration data that is produced by the logic design system can be used to implement a desired logic design with few, if any, significant performance penalties, while still reducing gate leakage power consumption.

A logic designer can provide the logic design system with a desired logic design using design entry tools. During the design entry process or at another suitable time, the logic designer can inform the logic design system of which signals are likely to be high and which signals are likely to be low. For example, the logic designer can provide the logic design system with the expected fraction of time that each signal is expected to be high (e.g., ¾ of the time). The logic designer may also provide the logic design system with information on signal types (e.g., which signals are enable signals, clock signals, data signals, etc.) If desired, the logic design system can automatically analyze the logic design to determine which signals are likely to be high.

Certain signals on the programmable logic device may be high nearly all of the time (e.g., 99% or 90% or more). Other signals will typically be low. Logic and interconnect resources on a programmable logic device are generally flexible enough that a given logic design can be implemented in a number of different ways, while satisfying design constraints such as desired clock speed, jitter, throughput, etc. By using this inherent flexibility, the logic design system can produce configuration data that routes signals that are often high to transistors high in the logic gate stacks and that routes signals that are often low to transistors low in the logic gate stacks. The position in the transistor stack to which each signal is routed depends on the amount of time that the signal is expected to be high or low during operation of the programmable logic device. By rerouting the signals in this way, gate leakage power consumption can be minimized while required levels of logic performance are maintained.

Further features of the invention, its nature and various advantages will be more apparent from the accompanying drawings and the following detailed description of the preferred embodiments.

BRIEF DESCRIPTION OF THE DRAWINGS

FIG. 7 is a table showing how the transistors higher in a logic gate stack exhibit lower gate leakage than transistor that are lower in a logic gate stack.

FIG. 8 is a schematic diagram of part of an illustrative NAND gate that is receiving the signal inputs shown in the first row of the table of FIG. 7.

FIG. 9 is a schematic diagram of part of an illustrative NAND gate that is receiving the signal inputs shown in the second row of the table of FIG. 7.

FIG. 10 is a schematic diagram of part of an illustrative NAND gate that is receiving the signal inputs shown in the third row of the table of FIG. 7.

DETAILED DESCRIPTION OF THE PREFERRED EMBODIMENTS

The present invention relates to programmable logic devices. The invention also relates to systems for designing and programming programmable logic devices so as to reduce or minimize undesired power consumption arising from gate leakage effects.

Figure 1:
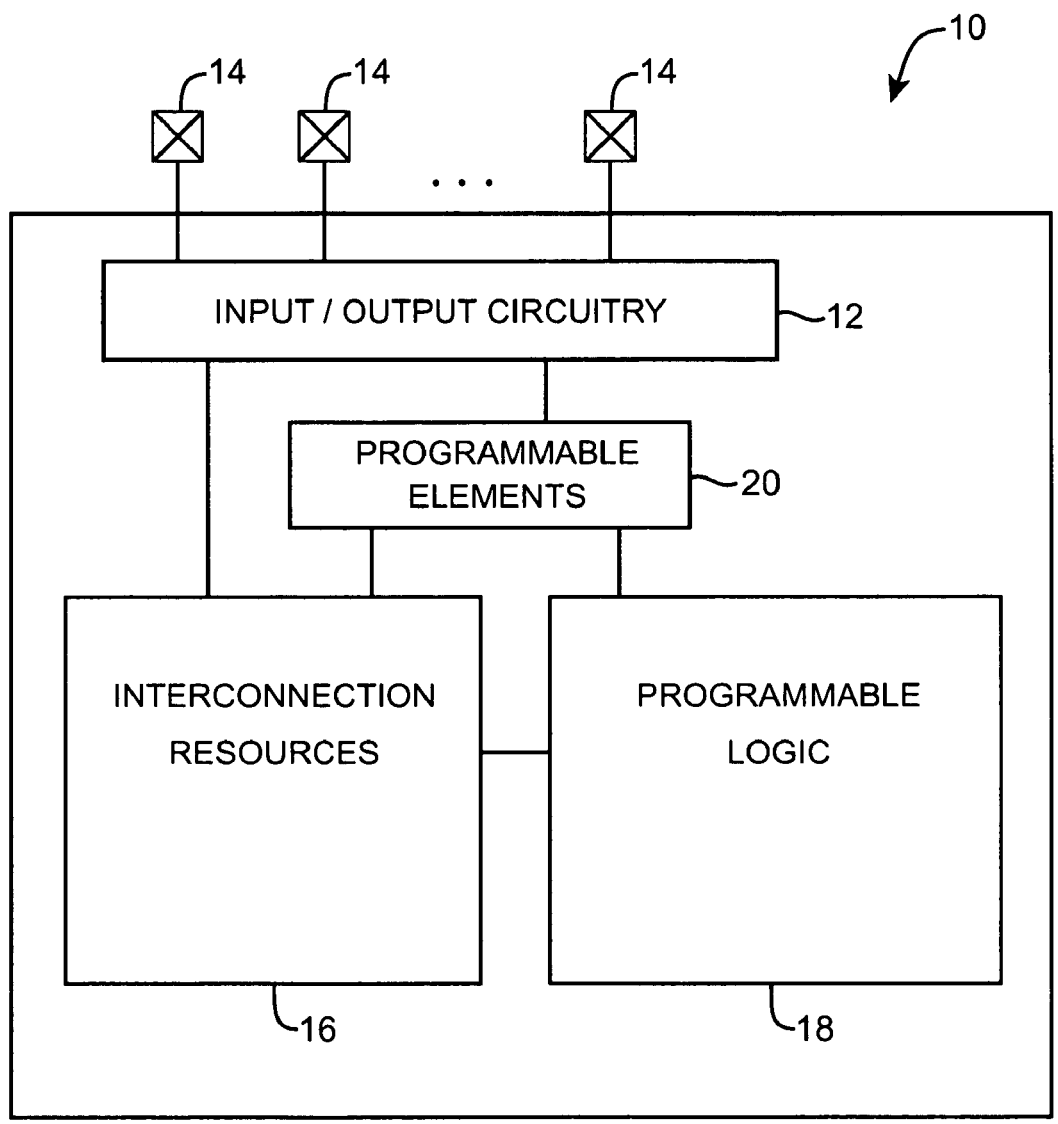
FIG. 1 is a schematic diagram of an illustrative programmable logic device integrated circuit in accordance with the present invention.

An illustrative programmable logic device 10 in accordance with the present invention is shown in FIG. 1.

Programmable logic device 10 may have input/output circuitry 12 for driving signals off of device 10 and for receiving signals from other devices via input/output pins 14. Interconnection resources 16 such as global and local vertical and horizontal conductive lines and busses may be used to route signals on device 10. Programmable logic 18 may include combinational and sequential logic circuitry including logic gates, multiplexers, memory blocks, look-up-tables, logic arrays, etc. These illustrative components are not mutually exclusive. For example, look-up tables and other components include logic gates. Some of the logic of programmable logic device 10 is fixed. Programmable logic 18 includes components that may be configured so that device 10 performs a desired custom logic function.

Programmable logic device 10 may be based on any suitable programmable technology. With one suitable approach, configuration data (also called programming data) may be loaded into programmable elements 20 using pins 14 and input/output circuitry 12. The programmable elements (also sometimes called configuration bits or programmable function control elements) may each provide a static control output signal that controls the state of an associated logic component in programmable logic 18.

In a typical arrangement, the programmable elements 20 may be random-access memory (RAM) cells that are loaded from an external erasable-programmable read-only memory chip via pins 14 and input/output circuitry 12. The loaded RAM cells 20 provide static control signals that are applied to the terminals (e.g., the gates) of circuit elements (e.g., metal-oxide-semiconductor transistors) in programmable logic 18 to control those elements (e.g., to turn certain transistors on or off) and thereby configure the logic in programmable logic 18. Circuit elements in input/output circuitry 12 and interconnection resources 16 are also generally configured as part of the programming process. The circuit elements that are configured in input/output circuitry 12, interconnection resources 16, and programmable logic 18 may be transistors such as pass transistors or parts of multiplexers, look-up tables, logic arrays, AND, OR, NAND, and NOR logic gates, etc.

RAM-based programmable logic device technology is merely one illustrative example of the type of technology that may be used to implement programmable logic device 10. Other suitable programmable logic device technologies that may be used for device 10 include one-time programmable device arrangements such as those based on programmable logic elements made from fuses or antifuses, programmable logic devices in which elements 20 are formed from electrically-programmable read-only-memory (EPROM) or erasable-electrically-programmable read-only-memory (EEPROM) technology, or programmable logic devices with programmable elements made from magnetic storage elements, etc.

Regardless of the particular type of programmable element arrangement that is used for device 10, programmable elements are preferably provided with configuration data by a user (e.g., a logic designer). Once provided with configuration data, the programmable elements 20 selectively control (e.g., turn on and off) portions of the circuitry in the programmable logic 18 and thereby customize its functions so that it will operate as desired.

The circuitry of device 10 may be organized using any suitable architecture. As an example, the logic of programmable logic device 10 may be organized in a series of rows and columns of larger programmable logic regions or areas each of which contains multiple smaller logic regions or areas (e.g., areas of logic based on look-up tables or macrocells). These logic resources may be interconnected by interconnection resources such as associated vertical and horizontal interconnection conductors. Interconnection conductors may include global conductive lines that span substantially all of device 10, fractional lines such as half-lines or quarter lines that span part of device 10, staggered lines of a particular length (e.g., sufficient to interconnect several logic areas), smaller local lines that interconnect small logic regions in a given portion of device 10, or any other suitable interconnection resource arrangement. If desired, the logic of device 10 may be arranged in more levels or layers in which multiple large areas are interconnected to form still larger portions of logic. Still other device arrangements may use logic that is not arranged in rows and columns.

Figure 2:
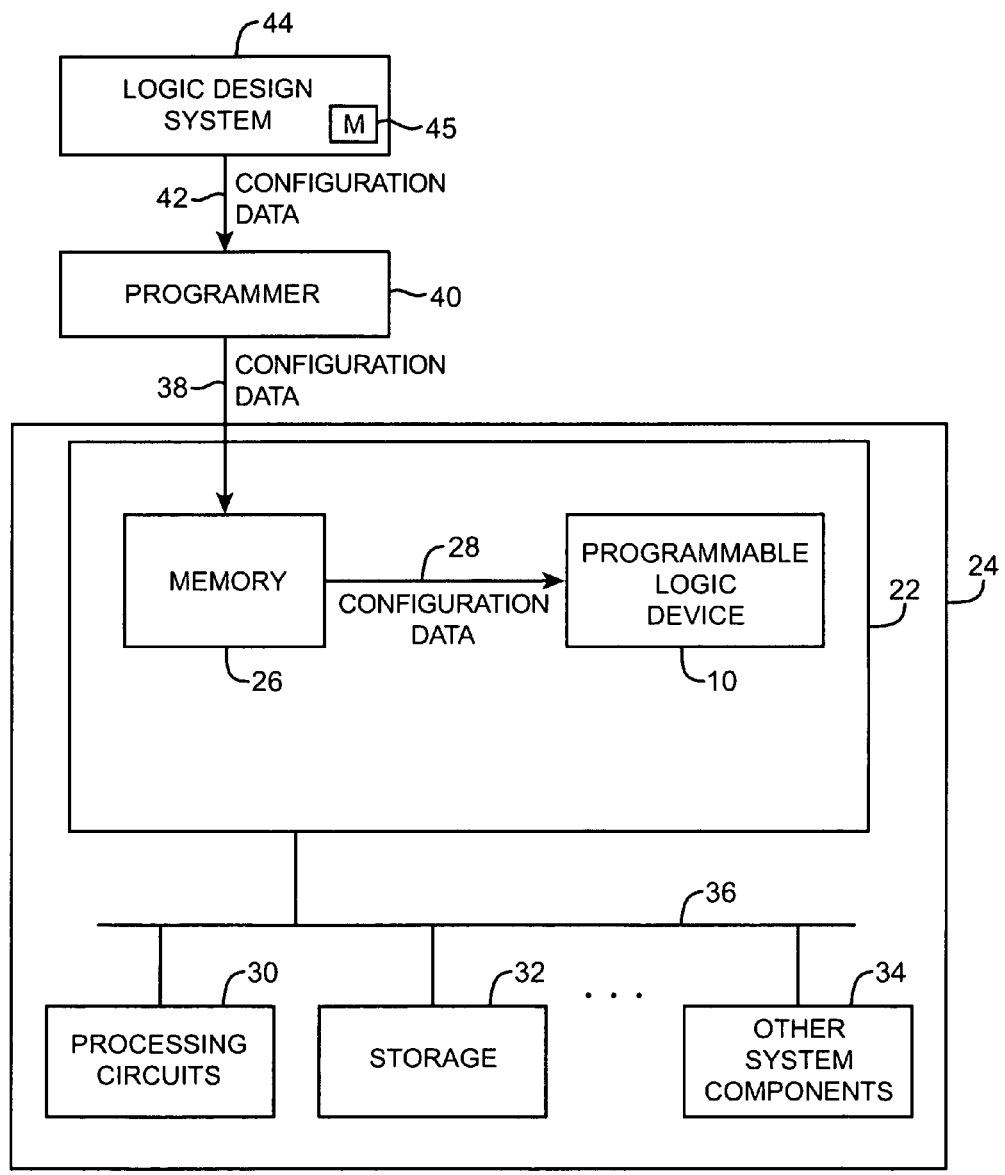
FIG. 2 is a schematic diagram of an illustrative system based on a programmable logic device in accordance with the present invention.

An illustrative system environment for a programmable logic device 10 is shown in FIG. 2. Programmable logic device 10 may be mounted on a board 22 in a system 24. In general, programmable logic device 10 may receive programming data from programming equipment or from any other suitable equipment or device. In the example of FIG. 2, programmable logic device 10 is the type of programmable logic device that receives configuration data from an associated memory chip 26. With this type of arrangement, memory chip 26 may, if desired, be mounted on the same board 22 as programmable logic device 10. The memory 26 may be an EPROM chip or other non-volatile memory device. When system 24 boots up (or at another suitable time), the configuration data for configuring the programmable logic device may be supplied to programmable logic device 10 from memory 26 via path 28. The configuration data that is supplied to the programmable logic device may be stored in the programmable logic device in configuration data cells (memory).

System 24 may include processing circuits 30, storage 32, and other system components 34. The components of system 24 may be located on one or more boards such as board 22 or other suitable mounting structures or housings and may be interconnected by busses and other electrical paths 36.

Memory 26 may be supplied with the configuration data for device 10 over a path such as path 38. Memory 26 may, for example, receive the configuration data from a programmer 40 (e.g., an EPROM programmer) or other suitable equipment that stores this data in device 26.

It can be a significant undertaking to design and implement a desired logic circuit in a programmable logic device. Logic designers therefore generally want to use logic design systems based on computer-aided-design (CAD) tools to assist them in designing circuits. A logic design system can help a logic designer design and test a complex circuit. When a design is complete, the logic design system may be used to generate configuration data for programming the appropriate programmable logic device.

As shown in FIG. 2, the configuration data produced by a logic design system 44 may be provided to programmer 40 over a path such as path 42. The programmer 40 can program the configuration data into memory 26, so that memory 26 can later provide this configuration data to the programmable logic device 10 over path 28.

In arrangements of the type shown in FIG. 2, the programmable logic device 10 may have configuration data cells formed from memory cells such as static random-access memory cells. This is merely one illustrative arrangement for programming a programmable logic device 10. Any suitable arrangement for programming programmable logic device 10 may be used if desired. For example, programmable logic device 10 may be based on non-volatile configuration data cells such as erasable-programmable read-only memory (EPROM) cells. With this type of arrangement, device 10 can be configured by programming the configuration data into the EPROM cells on the device. Programmable logic device 10 may also be based on programmable elements such as fuses and antifuses or programmable elements based on other technologies (e.g., magnetic devices, etc.).

Regardless of the particular approach used for programming programmable logic device 10, programmable logic device 10 can be configured using configuration data produced by a logic design system 44.

Logic design system 44 includes storage 45. Software is used to implement the functions of system 44. The software may be stored on a computer-readable medium (storage) 45. Storage 45 may include computer memory chips, removable and fixed media such as hard disk drives, flash memory, compact discs (CDs), DVDs, and floppy diskettes, tapes, or any other suitable memory or storage device(s). When the software of system 44 is installed, storage 45 has instructions and data that cause the computing equipment in logic design system 44 to execute various methods (processes). When performing these processes, the computing equipment is configured to implement the functions of the logic design system 44.

The configuration data produced by the logic design system 44 determines which switches and logic gates are used in the circuitry of the configured programmable logic device 10. For example, the configuration data determines whether certain electrical pathways conduct electrical signals or form open circuits. During the configuration process, logic gates such as NAND, NOR, AND, and OR gates are configured with the configuration data. Both individual gates and gates that are formed as part of a logic array or other circuitry can be configured in this way.

As an example, programmable logic device 10 may contain array logic such as AND-OR logic for forming a so-called sum of products. With this type of arrangement, a programmable AND array is used to implement a desired AND function on its inputs. The outputs of the AND array, which are called product terms, are combined (summed) using OR logic to form the sum-of-products.

Through the selective programming of the logic gates in logic arrays and other portions of the programmable logic device 10, a wide variety of complex logic circuit functions can be implemented.

Because of the inherent flexibility of programmable logic devices, it is generally possible to implement a given logic function using many different logic configurations. For example, a data signal can often be routed from one portion of a programmable logic device to another using a multitude of different potential interconnect paths. As another example, there may be numerous similar regions of logic that are all capable of implementing a desired circuit, such as a counter, shift register, etc. There may, for example, be many identical look-up tables or macrocells on the programmable logic device, each of which is capable of implementing a particular desired circuit.

Although there may be many functionally-equivalent ways in which to program a given programmable logic device, some configurations are better than others. For example, it is generally desirable to use as few resources as possible on the programmable logic device. A logic design that uses 100 logic gates to implement a desired function will therefore generally be favored over a logic design that uses 2000 logic gates to achieve the same function. Similarly, it is generally considered a poor practice to use excessively long interconnect paths to route signals on a device, because this can lead to excessive propagation delays and undesirable circuit loading effects. A design that uses short and direct interconnect paths rather than lengthy and complex interconnect paths will generally have superior performance.

Another consideration is power consumption. With the approach of the present invention, it is possible to reduce power consumption due to gate leakage effects by optimizing a given circuit design. Using the approach of the present invention, it is often possible to lower power consumption without adversely affecting performance in other respects. For example, power consumption can often be lowered without unduly affecting the amount of circuit resources that are consumed and without introducing significant additional routing delays. In some situations there may be no discernable penalty associated with the reduction in power consumption.

There are a number of factors that influence the overall power consumption of an integrated circuit. One portion of the power consumed by a programmable logic device arises from gate leakage effects in the metal-oxide-semiconductor (MOS) transistor structures that are typically used to form modern programmable logic device circuits. Gate leakage can consume power even when a transistor is in a relatively static state.

Figure 3:
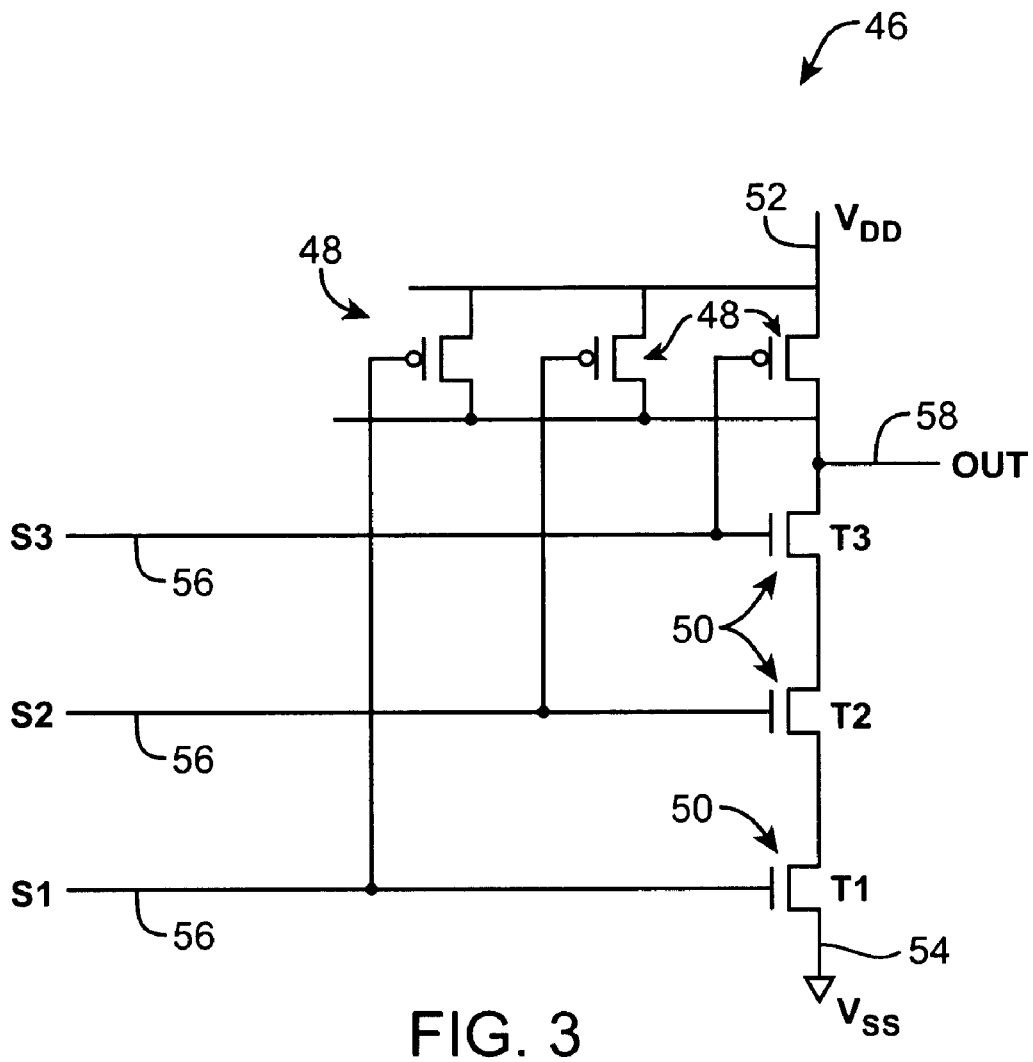
FIG. 3 is a circuit diagram of an illustrative NAND gate in accordance with the present invention.

An illustrative logic gate in programmable logic device 10 that is formed from MOS devices is shown in FIG. 3. The logic gate of FIG. 3 is a NAND gate 46, but this is merely illustrative. In general, device 10 has numerous logic gates of different types (NAND, AND, NOR, OR) and has many other circuit components. The NAND gate 46 of FIG. 3 is only used as an example.

The NAND gate 46 has p-channel MOS transistors 48 and n-channel MOS transistors 50. The NAND gate 46 is powered by a power supply voltage $V_{DD}$ at terminal 52 (e.g., a power supply voltage of 1.5 volts). A voltage $V_{SS}$ (e.g., a ground voltage of 0 volts) is supplied at terminal 54. Input signals S1, S2, and S3 are applied to terminals 56.

If any of the inputs 56 is a logic low (e.g., a voltage of about $V_{SS}$), the n-channel transistor 50 that is connected to that input will turn off, thereby allowing OUT terminal 58 to float, while the p-channel transistor 48 that is connected to that input will turn on and pull the OUT terminal 58 to $V_{DD}$ (i.e., to a logic high). If all of the inputs are high, the n-channel transistors 50 will all be on, while p-channel transistors 48 will all be off. In this situation, OUT will be pulled to $V_{SS}$ (i.e., to a logic low). The NAND gate 46 therefore performs a NAND operation on the inputs 56 and produces a corresponding output signal OUT on terminal 58.

Figure 4:
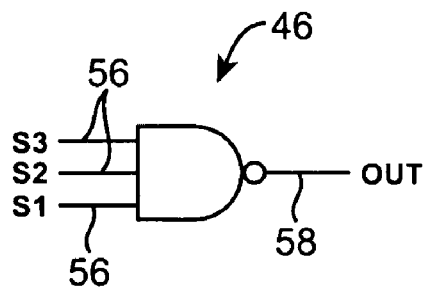
FIG. 4 is a schematic diagram of the illustrative NAND gate of FIG. 3 in accordance with the present invention.

The logic symbol representation of NAND gate 46 of FIG. 3 is shown in FIG. 4. In the logic symbol representation of NAND gate 46 of FIG. 4, it appears as if each of the inputs associated with signals S1, S2, and S3 is the same. However, as made clear by the circuit diagram of FIG. 3, in an actual programmable logic device circuit implementation of gate 46, the circuit position of each transistor 50 is different. As a result of these differences, certain input conditions are more likely to lead to high gate leakage than others.

Because of the somewhat vertical configuration of transistors T1, T2, and T3 in the circuit representation of FIG. 3, these transistors are said to form a "stack." Transistor T1 is the lowest in the stack, as it appears at the bottom of the diagram, nearest to the ground voltage $V_{SS}$. Transistor T3 is the highest in the stack, as it appears adjacent to the p-channel transistors 48, voltage supply 52, and output 58. Transistor T2 is in the middle of the stack.

The tendency of transistors 50 to exhibit different amounts of gate leakage depending on their location in a logic circuit is called the "stacking effect." This effect (which occurs even if the transistors are not arranged exactly as shown in FIG. 3) arises because a transistor in one position in the stack (like transistor T3 in the NAND gate example of FIG. 3) does not generally experience the same voltages as a transistor in another position in the stack (like transistor T1 in the NAND gate example of FIG. 3). Because gate leakage depends on the magnitude of the voltage applied across the transistor's gate oxide, the gate leakage, and therefore the gate leakage power consumption of each transistor in the stack can vary depending on its position in the stack. (The transistors T1, T2, and T3 in the stack of NAND gate 46 are NMOS transistors, but the same "stacking effect" occurs in logic gates such as NOR gates that have stacked PMOS transistors.)

The dependence of a transistor's gate leakage on the transistor's circuit environment arises because the voltages on the terminals of the transistor structure vary depending on the state of the circuit. An example showing how a MOS transistor 60 may experience different amounts of gate leakage depending on the voltages on the terminals of the transistor 60 is shown in FIGS. 5 and 6.

Figure 5:
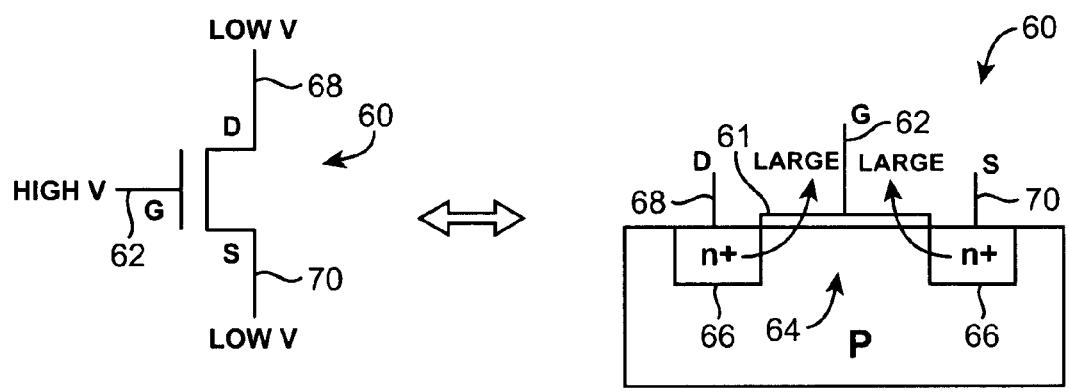
FIG. 5 is a schematic diagram showing gate leakage effects in a configuration in which a transistor has relatively high gate leakage.
Figure 6:
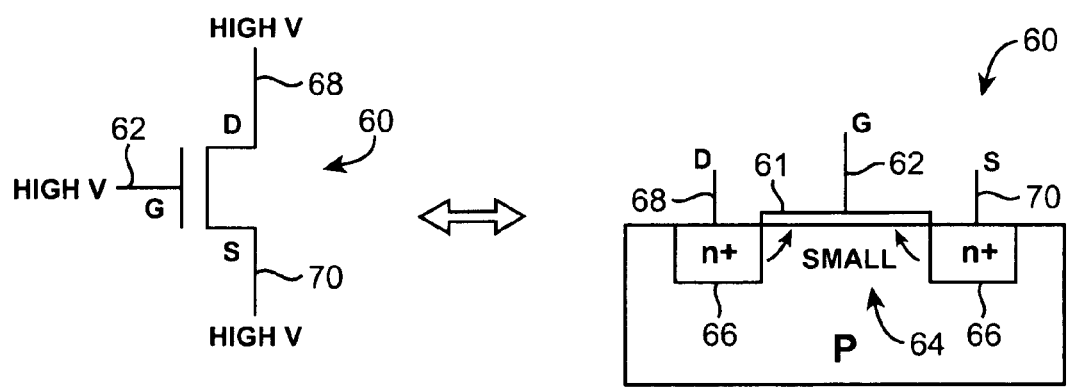
FIG. 6 is a schematic diagram showing gate leakage effects in a configuration in which a transistor has relatively low gate leakage.

Transistor 60 of FIGS. 5 and 6 has a gate terminal 62, a drain terminal 68, and a source terminal 70. The gate 62 of the transistor 60 has an associated gate oxide 61. The voltage across the gate oxide 61 depends on the voltages on the gate terminal 62 and source and drain terminals 68 and 70. When the voltage across gate oxide 61 is low, the leakage current though the gate oxide due to tunneling effects is low. When the voltage across gate oxide 61 is high, the leakage current through the gate oxide due to tunneling is high. High gate leakage currents lead to unwanted power dissipation.

During operation of transistor 60, signals are applied to the gate 62 of the transistor. When a logic low signal (e.g., a low voltage of about $V_{SS}$) is applied to the gate, the transistor 60 is turned off and its power dissipation is relatively low. When a logic high signal (e.g., a high voltage of about $V_{DD}$) is applied to the gate, the transistor 60 is turned on. Depending on the voltages at the drain and source terminals, the power consumption of the transistor 60 due to gate leakage effects can be either high or low. In the illustrative situations shown in FIGS. 5 and 6, the gate voltage is high. In the illustrative situation shown in FIG. 5, the gate leakage is high. In the illustrative situation shown in FIG. 6, the gate leakage is low.

In the example of FIG. 5, the voltage on the gate is high, the voltage on the source is low, and the voltage on the drain is low. As shown on the right-hand side of FIG. 5, the low voltages on the drain terminal 68 and source terminal 70 are applied to the lower side 64 of gate oxide 61 via highly-doped n+ regions 66. The high voltage on the gate terminal 62 is applied to the upper side of the gate oxide 61 by the gate contact (not shown). Because the voltage on one side of the gate oxide is low while the voltage on the other side of the gate oxide is high, the voltage drop across the gate oxide 61 is high. Although the gate oxide (or other insulating gate layer) is formed from an insulating material, quantum-mechanical effects allow a non-negligible "tunneling" current to flow through the gate oxide 61. In the configuration of FIG. 5, the voltage drop across the gate oxide 61 is high, so the tunneling current is relatively high.

In the situation shown in FIG. 6, the voltages on the drain 68 and source 70 are high (e.g., about $V_{DD}$). When the voltages of the transistor's drain and source are high, the voltage drop across the gate oxide 61 is relatively low. As a result, when the voltages of the drain and source are high, the tunneling current though gate oxide 61 is relatively small.

The power consumption due to gate leakage effects can be reduced by configuring the programmable logic device 10 to maximize the operation of its transistors in the low-gate-leakage situation of FIG. 6 and to minimize the operation of its transistors in the high-gate-leakage situation of FIG. 5.

The way in which the position of a transistor in a logic gate stack affects the magnitude of that transistor's gate leakage is shown in the table of FIG. 7 and the accompanying transistor stack diagrams of FIGS. 8, 9 and 10. These FIGS. illustrate how a given logic gate can consume different amounts of power depending on the signals it receives. The stack of FIGS. 8, 9, and 10 may, for example, correspond to the n-channel MOS transistor stack of a logic NAND gate of the type shown in FIG. 3. To avoid over-complicating the drawings, only the stack portion of the gate is shown in FIGS. 8, 9, and 10.

The table of FIG. 7 has eight rows. Each row corresponds to a different set of potential input signals S1, S2, and S3 that may be applied to the transistors T1, T2, and T3 in the NAND gate stack. The signals S1, S2, and S3 are logic signals that are either at a logical high value (e.g., a "1") or a logical low value (e.g., a "0"). In the illustrative example of FIGS. 7–10, the logical high values (the 1s) are represented by a relatively high voltage (e.g., a voltage of about $V_{DD}$), whereas the logical low values (the 0s) are a represented by low voltage (e.g., a voltage of about $V_{SS}$). This is merely an illustrative configuration. If desired, a logic 1 could be represented by a low voltage and a logic 0 could be represented by a high voltage.

The entries in the columns labeled T1, T2, and T3 in the table of FIG. 7 show how much leakage is associated with transistors T1, T2, and T3.

When the logic gate receives inputs S1, S2, and S3 that are all low (0), the transistors T1, T2, and T3 all have low voltages on their gates. This situation is shown in row 1 of the table of FIG. 7 and is illustrated in the stack diagram of FIG. 8. As shown by the T1, T2, and T3 entries in the first row of the table of FIG. 7, when S1, S2, and S3 are low, the amount of gate leakage associated with T1, T2, and T3 is essentially zero.

During normal operation of a logic circuit, some signals are high at least some of the time. When the logic gate of FIGS. 8–10 receives high logic signals, the gate leakage is not zero, as shown by the entries in rows 2–8 of the table of FIG. 7. Consider, for example, the situation in which a single input is high.

If the high signal is applied to the input S3, the transistor T3 will be on and transistors T2 and T1 will be off, as shown in FIG. 9. The resulting gate leakage currents for transistors T1, T2, and T3 are shown in row 2 of the table of FIG. 7. As shown in FIG. 9, when transistors T1 and T2 are off, they do not conduct. As a result, their drain-to-source resistances are high and transistors T1 and T2 act as open circuits. Because the gate voltages S1 and S2 are low, the gate leakage of transistors T1 and T2 is zero, as shown in row 2 of FIG. 7. Transistor T3 is on, so its drain-to-source resistance is very low. In this situation, the voltage at node 72 is about $V_{DD}$-$V_T$ (the power supply voltage minus about one transistor threshold voltage). With the drain voltage of transistor T3 at terminal 74 high ($V_{DD}$) and the source voltage at terminal 72 moderately high ($V_{DD}$-$V_T$), the voltage across the gate oxide of transistor T3 is low. Transistor T3 therefore exhibits a relatively low gate leakage, as described in connection with FIG. 6. The low gate leakage of transistor T3 in this situation is shown by the "low" entry in the T3 column of row 2 in FIG. 7.

If the high signal is applied to the input S2, the transistor T2 will be on and transistors T1 and T3 will be off, as shown in FIG. 10. The resulting gate leakage currents for transistors T1, T2, and T3 are shown in row 3 of the table of FIG. 7. When transistors T1 and T3 are off, their drain-to-source resistances are high and they act as open circuits. Because the gate voltages S1 and S3 are low, the gate leakage of transistors T1 and T3 is zero, as shown in row 3 of FIG. 7. Because transistor T2 is on, its drain-to-source resistance is very low. With the drain-to-source resistance of transistor T2 low and the drain-to-source resistance of transistor T1 and T3 high, the voltage drop from terminal 74 to terminal 76 in the logic gate of FIG. 10 is split roughly equally between the two high-resistance loads (T1 and T3). As a result, the voltage at both terminals 72 and 78 is approximately $V_{DD}$/2. A voltage of about $V_{DD}$/2 is therefore applied across the gate oxide of transistor T2. This produces a relatively high level of gate leakage, as shown by the T2 entry in row 3 of FIG. 7.

As shown by this example, the gate leakage of a logic circuit with one signal that is generally high and two that are generally low will be higher if the high signal is routed to transistor T2 than if the high signal is routed to transistor T3. The transistor that is higher in the stack (T3) exhibits less leakage when it handles the high signal than the transistor lower in the stack (T2).

A more thorough analysis can be performed by examining all eight possible signal configurations for the signals S1, S2, and S3. As shown by the table of FIG. 7, the transistors that are higher in the stack generally handle high logic signals better (with lower resulting gate leakage) than the transistors lower in the stack. For example, transistor T3, which is the highest transistor in the stack, exhibits high gate leakage only in one configuration (corresponding to row 8). In contrast, transistor T1, which is the lowest transistor in the stack, exhibits high gate leakage in four out of eight situations (corresponding to rows 5–8). The transistor in the middle of the stack, T2, falls between these extremes. In three out of eight signal configurations (see rows 3, 7, and 8) the gate leakage of T2 is high and in one signal configuration (row 4) the gate leakage of T2 is low (but not zero).

As shown by this analysis, a logic NAND gate made up of three series-connected n-channel MOS transistors will exhibit its best leakage current performance if the signals with the greatest probability of being high are handled by the transistors near the top of the stack while the signals with the lowest probability of being high are handled by the transistors closer to the bottom of the stack. Taking the stacking effect into account when determining how to implement a given logic design in the programmable logic device can therefore reduce gate leakage currents. By routing signals to positions in the stacks based on the amount of time that each signal is expected to be high, power consumption can be reduced.

The stacking effect may be taken into account when the logic design system 44 (FIG. 2) decides how best to implement a desired logic design. The logic design system 44 can produce configuration data for the programmable logic device 10 that routes signals that are known to be high or that have a relatively greater probability of being high to transistors that are higher in the stacks of the device's logic gates, thereby reducing gate leakage power consumption. The logic design system can also take into account other optimization criteria such as signal delay criteria, circuit area (real estate) criteria, etc.

Programmable logic device 10 may contain array logic. For example, programmable logic device 10 may contain one or more AND, NAND, OR, or NOR logic arrays or other suitable arrays of logic gates. Array logic is often used to implement a so-called "sum-of-products" logic. With one suitable configuration, a first level of logic (a programmable AND array) may be used to form products of its input signals. A second level of logic (e.g., OR logic) may then be used to sum the resulting product terms. According to DeMorgan's theorem, the various possible two-level logic schemes (AND-OR, NAND-NOR, NAND—NAND, OR—OR, etc.) are all logical equivalents of each other. For clarity, a two-level logic scheme based on NAND—NAND logic will be described. This is merely illustrative. Any suitable array logic exhibiting the stacking effect may be configured to benefit from gate leakage reduction if desired.

Figures 11, 12, 13:
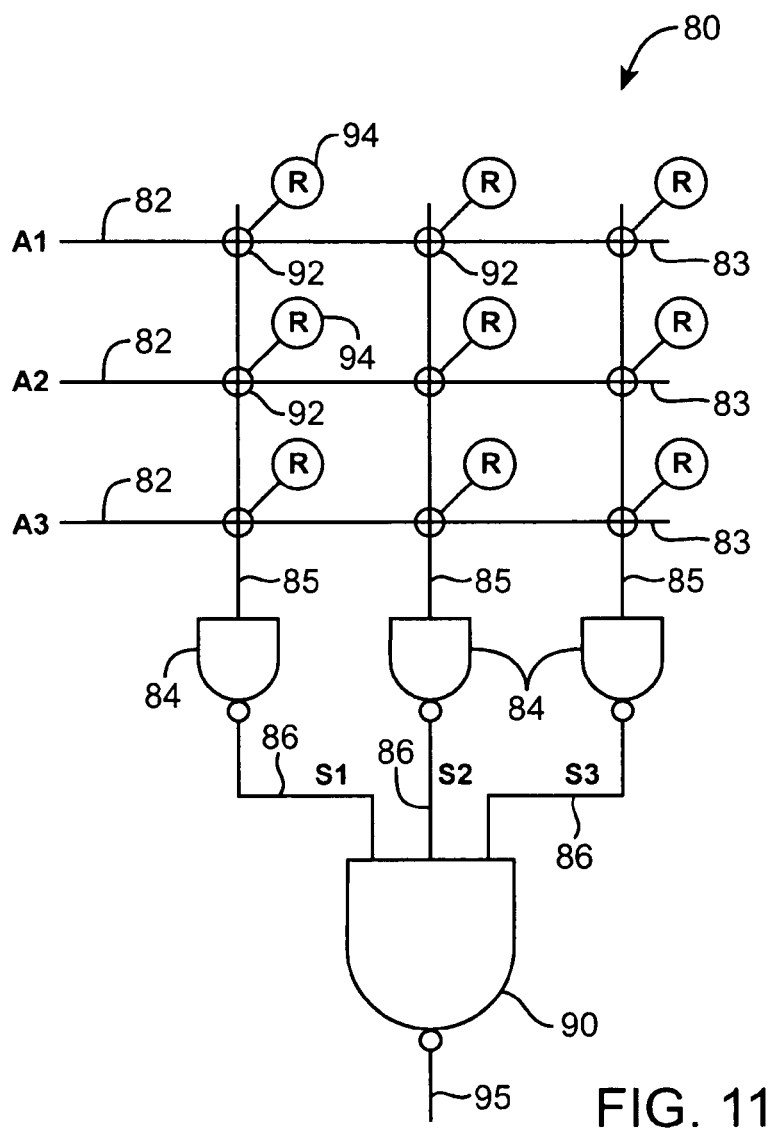
FIG. 11 is a circuit diagram of a portion of an illustrative programmable logic array circuit in a programmable logic device in accordance with the present invention.
FIG. 12 is a table of configuration data that could be used to program the programmable logic device logic array circuitry of FIG. 11.
FIG. 13 is a table of alternative configuration data that could be used to program the programmable logic array circuit of FIG. 11 so as to reduce its gate leakage current in accordance with the present invention.

An illustrative NAND—NAND implementation of two-level array logic for programmable logic device 10 is shown in FIG. 11. In the arrangement of FIG. 11, the first level of logic is formed by NAND array 80. NAND array 80 has three rows and three columns. Each row receives an input signal A1, A2, or A3 at a corresponding input 82 connected to a corresponding horizontal line 83. The horizontal lines 83 in the array 80 are programmably connected to vertical lines 85.

The programmable connections between the horizontal and vertical lines of array 80 are represented by circles 92. Programmable elements 92 may, for example, be based on transistors controlled by RAM cells 94 or other suitable programmable circuit elements. The states of the elements 92 may be controlled by placing suitable configuration data in RAM cells 94 or other suitable storage elements. (In different types of programmable logic devices, the configuration data will be used to configure array logic resources differently. The example of FIG. 11 is merely illustrative.)

If a given connection in array 80 is placed in one state (e.g., by a 0 RAM bit applied by a corresponding configuration data cell 94) that connection will not conduct. As a result, changes on the horizontal input line 83 that is associated with that connection will not have any affect on the vertical line 85 that is associated with the connection. If a given connection is placed in another state (e.g., by a 1 RAM bit applied by a corresponding configuration data cell 94) the programmable connection will be activated. In this situation, changes in the input line 83 associated with that programmable connection will affect the signal on the horizontal line 85 associated with that programmable connection.

In the example of FIG. 11, the array 80 is formed from NAND gates, as illustrated schematically by the NAND gate symbols 84 at the bottom of each vertical line 85. The programmable NAND logic array gates 84 of array 80 each have three potential input signals A1, A2, and A3. If all of the programmable connectors in a given column of array 80 are activated (e.g., by providing corresponding 1 bits to the programmable elements 92 in that column from the configuration cells 94 in the column), the output signal at the corresponding NAND gate output 86 will be the logical NAND function of the three inputs A1, A2, and A3. For example, if all of the programmable connectors 92 in the first column of array 80 are activated, the signal S1 on the output 86 associated with the first column of array 80 will be the NAND function of A1, A2, and A3. If all of the programmable connectors 92 in the second column of array 80 are activated, the signal S2 on the output 86 for the second column of array 80 will be the NAND function of A1, A2, and A3.

The signals S1, S2, and S3 that are produced by the NAND array 80 are provided to NAND gate 90. This logic gate completes the "sum-of-products" by providing a second level of logic. The sum-of-products signal performed on inputs A1, A2, and A3 is provided at output 95.

A given logic function can generally be implemented in a variety of ways using the same logic array. For example, consider the function f=A1 NAND A2. This function may be implemented in at least two ways in array 80. With one suitable arrangement, the NAND operation is performed on signals A1 and A2 using the NAND logic gate in the first column of array 80. With another suitable arrangement, the NAND operation is performed on signals A1 and A2 using the NAND logic gate in the third column of array 80. An illustrative set of configuration data that may be used to implement the first arrangement is shown in FIG. 12. Configuration data for the second arrangement is shown in FIG. 13.

Applying the configuration data shown in the rows and columns of the tables of FIGS. 12 and 13 to the array 80 programs the programmable elements 92 in the array to implement the desired function f. When the configuration data of FIG. 12 is used to program array 80, all of the programmable elements 92 in the array 80 that are shown in FIG. 11 are inactivated except for the elements 92 in the first and second rows of the first column. This ensures that the signals A1 and A2 are handled by the logic gate for the first column of array 80. When the configuration data of FIG. 13 is used to program array 80, all of the programmable elements 92 of FIG. 11 are inactivated except for the elements in the first and second rows of the third column.

Regardless of whether the configuration data of FIG. 12 or the configuration data of FIG. 13 is used to program the logic of array 80, the resulting logic function at outputs 86 will be the same. In both cases, the output resulting from the combination of A1 and A2 will be the logical NAND function of A1 and A2. When the configuration data of FIG. 12 is used, the first column of array 80 produces the desired output (i.e., S1=A1 NAND A2). When the configuration data of FIG. 13 is used, the desired function f is implemented using the third column of array 80 (i.e., S3=A1 NAND A2).

The outputs S1 and S3 are routed to the inputs of NAND gate 90. NAND gate 90 may be based on a NAND logic gate circuit of the type shown in FIG. 3. The signal line S3 may be applied to the gate of a transistor T3 at the top of a transistor stack, signal line S2 may be applied to the gate of a transistor T2 in the middle of the stack, and signal line S1 may be applied to a transistor T1 at the bottom of the stack.

With this type of logic gate arrangement, signal line S3 will be better able to handle high logic signals than signal line S1. This consideration may be taken into account when determining which configuration data to use to route the signal A1 NAND A2 into NAND gate 90. If A1 NAND A2 is likely to be high more often than the other signals feeding NAND gate 90 (i.e., signals provided using portions of the array 80 not shown in FIG. 11), the signal A1 NAND A2 should be routed to signal line S3 by using the configuration data of FIG. 13. If the A1 NAND A2 signal is likely to be low more often than other signals, those other signals should be routed to transistors T2 and T3 and the signal A1 NAND A2 should be routed to signal line S using the configuration data of FIG. 12.

Figure 14:
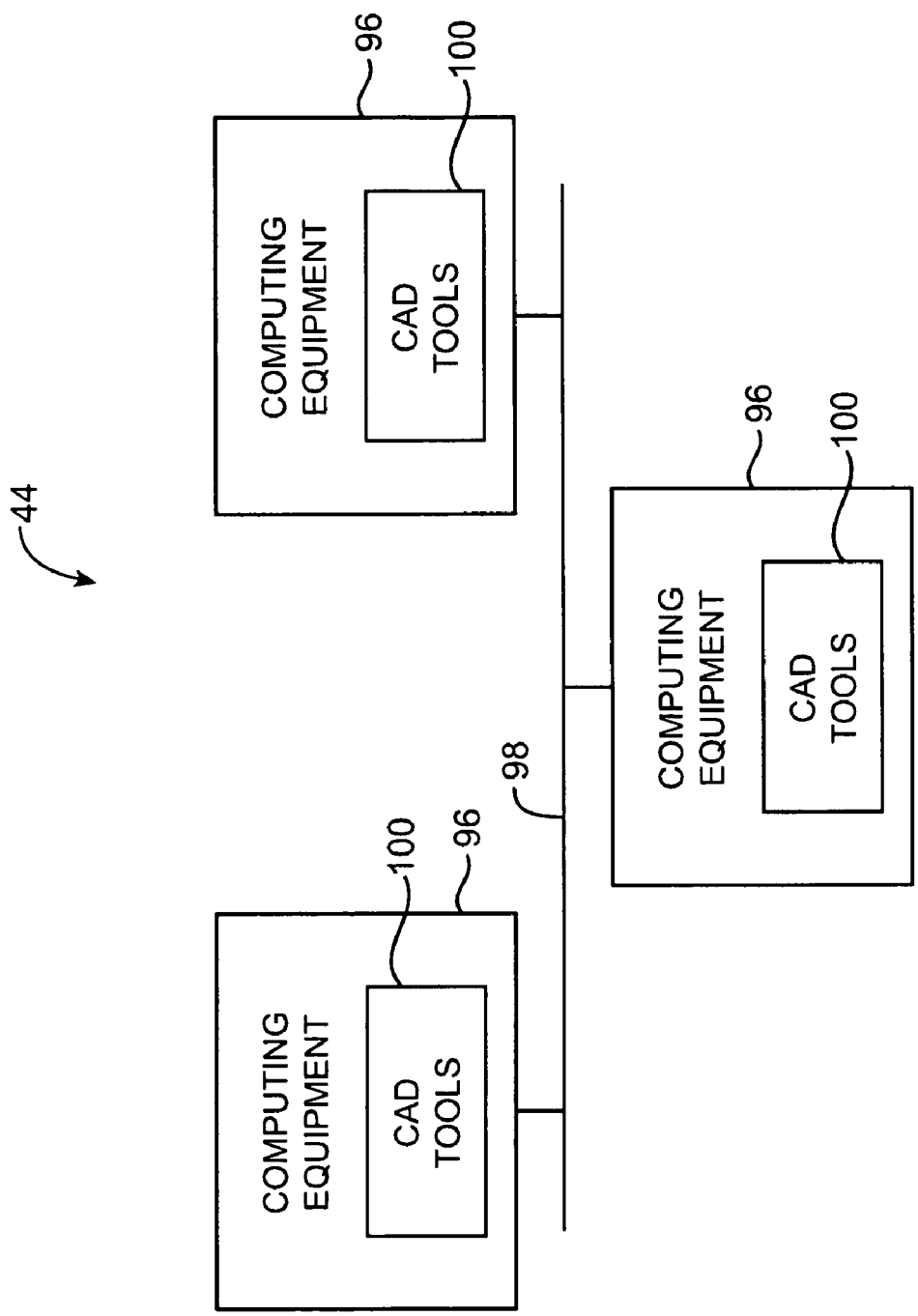
FIG. 14 is a schematic diagram of an illustrative logic design system in accordance with the present invention.

A logic design system 44 that may be used to produce configuration data that takes account of gate leakage effects when implementing logic designs is shown in FIG. 14. System 44 can produce configuration data for a programmable logic device that implements a desired logic design while routing signals to positions in the logic gate stacks of the device depending on the amount of time each signal is expected to be high.

System 44 may include computing equipment 96. Computing equipment 96 may include one or more personal computers, workstations, mainframe computers, or any other suitable processors or computer equipment. Computing equipment 96 may be interconnected using a communications network 98. Network 98 may be any suitable communications network such as a local area network, a wide area network, the Internet, or other suitable networks or a combination of such networks. System 44 may be operated by an individual or a group of individuals.

The features of system 44 may be implemented using one or more computer-aided-design tools 100. Different tools 100 or sets of tools 100 may be installed on each computer in system 44 if desired. Data may be passed between tools using a shared database, by transmitting data files using email or other suitable messaging system, or using any other suitable technique.

A logic circuit is typically designed by specifying a high-level function for the circuit to perform using system 44. The system 44 may then use automatic and manually-controlled operations to optimize the design for a given programmable logic device 10 (i.e., a particular programmable logic device product or family of products). During the design and optimization process, the effects of gate leakage may be taken into account to reduce standby power consumption. Once the optimization process is complete, the system 44 may produce suitable configuration data for use in programming the programmable logic device 10.

Figure 15:
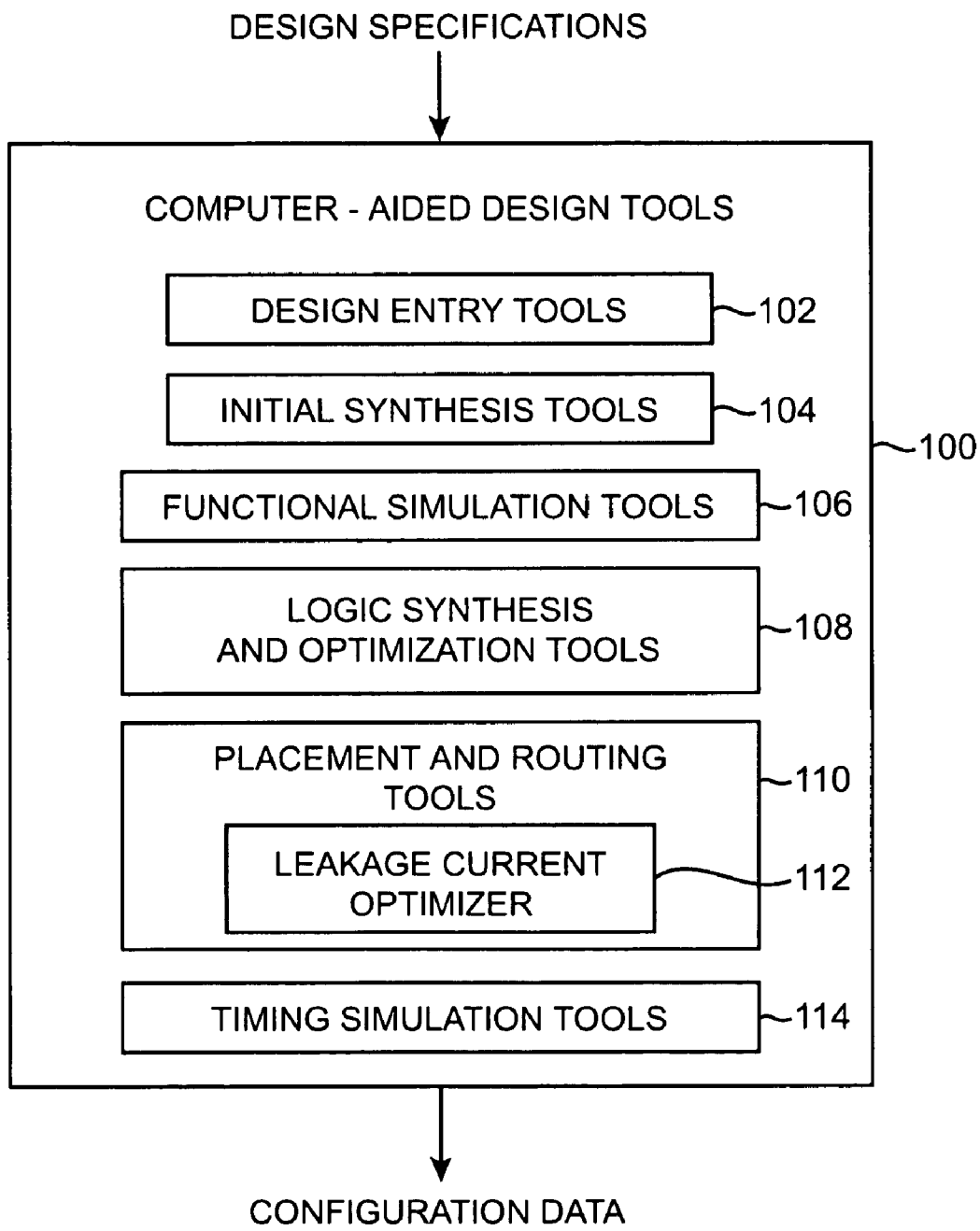
FIG. 15 is a schematic diagram of some of the computer-aided design tools that may be used in the logic design system of FIG. 14 in accordance with the present invention.

Illustrative computer-aided design tools 100 that may be used to produce the configuration data for the programmable logic device from a set of design specifications are shown in FIG. 15.

The design process typically starts with the formulation of logic circuit functional specifications. A logic designer can specify how a desired circuit should function using design entry tools 102. Design entry tools 102 may also be used to provide the logic designer with access to libraries of existing logic designs and computer-aided assistance in entering (specifying) the desired design.

Design entry tools 102 may be used to allow a logic designer to provide a desired logic design to logic system 44 using any suitable format. For example, design entry tools 102 may include tools that allow the logic designer to enter a logic design using truth tables. Truth tables can be specified using text files or timing diagrams and may be imported from a library. Truth table logic design entry may be used for a portion of a large circuit or for an entire circuit.

As another example, design entry tools 102 may include a schematic capture tool. A schematic capture tool may allow the logic designer to visually construct logic circuits from constituent parts such as logic gates and groups of logic gates. Libraries of preexisting logic circuits may be used to allow a desired portion of a design to be imported with the schematic capture tools.

If desired, design entry tools 102 may allow the logic designer to provide a logic design to the logic design system 44 using a hardware description language such as Verilog HDL or VHDL (Very High Speed Integrated Circuit Hardware Description Language). The logic designer can enter the logic design by writing hardware description language code. Blocks of code may be imported from libraries if desired.

After the design has been entered using design entry tools 102, initial synthesis tools 104 may be used to perform synthesis operations on the design. During synthesis, logic circuitry is generated by translating the truth-table, schematic, and/or hardware-description language design specifications into lower-level circuit descriptions.

Functional simulation tools 106 may be used to simulate the functional performance of the design. If the functional performance of the design is incomplete or incorrect, the logic designer can make changes to the design using design entry tools 102. The functional operation of the new design can be verified using functional simulation tools 106 after synthesis operations have been performed using tools 104. The output of the functional simulation tools 106 may be provided to the logic designer in any suitable format (e.g., truth tables, timing diagrams, etc.)

Once the functional operation of the logic design has been determined to be satisfactory, logic synthesis and optimization tools 108 may be used to implement the logic design in a particular programmable logic device (i.e., in the logic and interconnect resources of a particular programmable logic device product or product family). As an example, if the logic design includes a counter, the logic synthesis and optimization tools 108 may decide to use an available hardware-based counter circuit on the programmable logic device to perform the desired counter function. If, the logic design includes a counter and the programmable logic device being used does not have suitable counter hardware resources, the logic synthesis and optimization tools 108 may select appropriate logic gates to use to form a counter.

Tools 108 can optimize the design by proper selection of the available hardware to implement different logic functions in the logic design. Often tradeoffs are made because multiple logic functions are competing for limited resources.

After logic synthesis and optimization using tools 108, the logic design system may use tools such as placement and routing tools 110 to perform physical design steps (layout synthesis operations). Placement and routing tools 110 are used to determine how to place each logic function within the programmable logic device. For example, if two counters interact with each other, the placement and routing tools 110 may locate these counters in adjacent logic regions on the programmable logic device to minimize interconnect delays. The placement and routing tools 110 create orderly and efficient implementations of logic designs for a given programmable logic device.

Leakage current optimizer 112 may be incorporated into placement and routing tools 110, may be provided as part of another suitable CAD tool 100, may be provided as a stand-alone tool, or may be provided using a combination of these arrangements. Leakage current optimizer 112 takes account of the effects of gate leakage current. Leakage current optimizer 112 may be used to reduce standby power consumption due to gate leakage effects while satisfying other design constraints (e.g., constraints on various delay times, minimum clock speeds, jitter levels, projected error rates, data throughput metrics, etc.). As an example, leakage current optimizer 112 can route signals that are always high (i.e., 100% or 90–100% of the time) or that are relatively more likely to be high to locations higher in the logic gate stacks on the programmable logic device and can route signals that are always low or that are relatively more likely to be low to locations lower in the logic gate stacks. With this type of approach, leakage current optimizer 112 routes signals to positions in logic gate stacks based on the amount of time each signal is expected to be high. Signals that are expected to be high most often are routed to transistor gates higher in the stacks, because those transistors are best able to handle high voltages without experiencing undue gate leakage.

Leakage current optimizer may use information on the signals in the logic design when deciding how to best place and route the desired logic functions within the programmable logic device to minimize gate leakage power consumption. This information on the signals may be provided to the CAD tools 100 manually or may be generated automatically by the leakage current optimizer 112 or other suitable tool 100.

As an example, during design entry, the design entry tool may query the logic designer for information about certain signals. If a particular signal (e.g., an enable signal) is known by the logic designer to be high for all or substantially all normal operations, the logic designer can inform the appropriate design entry tool 102 accordingly. If another particular signal (e.g., an alarm) is known by the logic designer to be low for most normal operations, the logic designer can provide the logic design system with this information on the signals using design entry tool 102.

The logic designer may also provide the CAD tools 100 with information on signal types. Information on signal types may be provided to the CAD tools 100 by identifying signals as enable signals, disable signals, alarm signals, data signals, clock signals, or by providing the CAD tools 100 with other suitable information that can be used to identify the types of signals involved in the design or that can be used to determine probable or known characteristics of the signals. Any suitable user interface may be used to provide this information to tools 100. For example, design entry tools 102 may gather this information using suitable on-screen menu options, may gather this information in the form of high-level logic design language commands, etc.

Information on signals (i.e., information on whether signals are mostly high or are mostly low, information on signal types, or other known or probable characteristics) may be extracted from the logic design using initial synthesis tools 104, functional synthesis tools 106, logic synthesis and optimization tools 108, or any other suitable CAD tool 100. As an example, as test vectors are provided to a given portion of the logic design during the design and testing of the design using tools 100, the tools 100 may monitor the outputs of that portion of the design. Certain signals may always be high or may often be high in response to the test vectors, whereas other signals may generally be low. These test vector response behaviors may be monitored and corresponding signal statistics gathered using tools 100. As another example, the CAD tools 100 may perform static logic analysis operations to determine the likelihood of certain signals being high or low. Dynamic and static logic analysis techniques may use manually provided information on signals if desired.

The statistical information and other automatically-generated information on the signals that is produced by the CAD tools 100 and the information on the signals that was manually entered by the logic designer or derived from manually entered information may be used to reduce and/or minimize power consumption during the placement and routing operations performed by gate leakage current optimizer 112 and other placement and routing tools 112 (or may be used by leakage current optimizer 112 at another suitable time).

Minimal power consumption due to gate leakage effects is generally one of a number of criteria (constraints) that are used by the placement and routing tools 110 and other CAD tools 100. Other design criteria may include (for example), limits on the maximum or minimum allowed data throughput, maximum and/or minimum clock speeds or data speeds, limits on power consumption due to effects other than gate leakage (e.g., power consumption due to logic gate switching), limits on jitter or other time-based constraints, desired fault tolerance and/or error rates, etc. If desired, CAD tools 100 can take account of these types of design criteria in addition to taking account of gate leakage effects.

With one suitable approach, one or more of these criteria are taken into account during the placement and routing phase of producing the programmable logic design implementation of the desired logic design. If desired, however, these criteria may also be taken into account by tools 100 during other phases of the logic design process being handled by tools 100.

After an implementation of the desired logic design in the programmable logic device has been generated using placement and routing tools 110, the implementation of the design may be tested using simulation tools such as timing simulation tools 114. Timing simulation tools may, for example, predict the delay times that are associated with certain signal paths through the device. The timing simulation tools may be used to verify that the particular implementation of the design that is being tested does not contain signal paths with delays that are outside of the limits imposed during the design phase. For example, the timing simulation tools may be used to ensure that the slowest data paths are fast enough to ensure that the minimum desired clock speed and minimum signal path delay constraints are satisfied. The timing simulation tools may also examine the design for potential race conditions or other conditions that affect device performance.

After satisfactory testing using tools 114, the CAD tools 100 can produce the configuration data for the programmable logic device. Depending on the type of programmable logic device being used (e.g., a device based on non-volatile memory, a device based on volatile memory, a device based on fuses or antifuses, etc.), the configuration data may be programmed into the programmable logic device directly or may be provided to a memory device that later (e.g., upon power-up) loads the configuration data into the programmable logic device to program the device.

Figure 16:
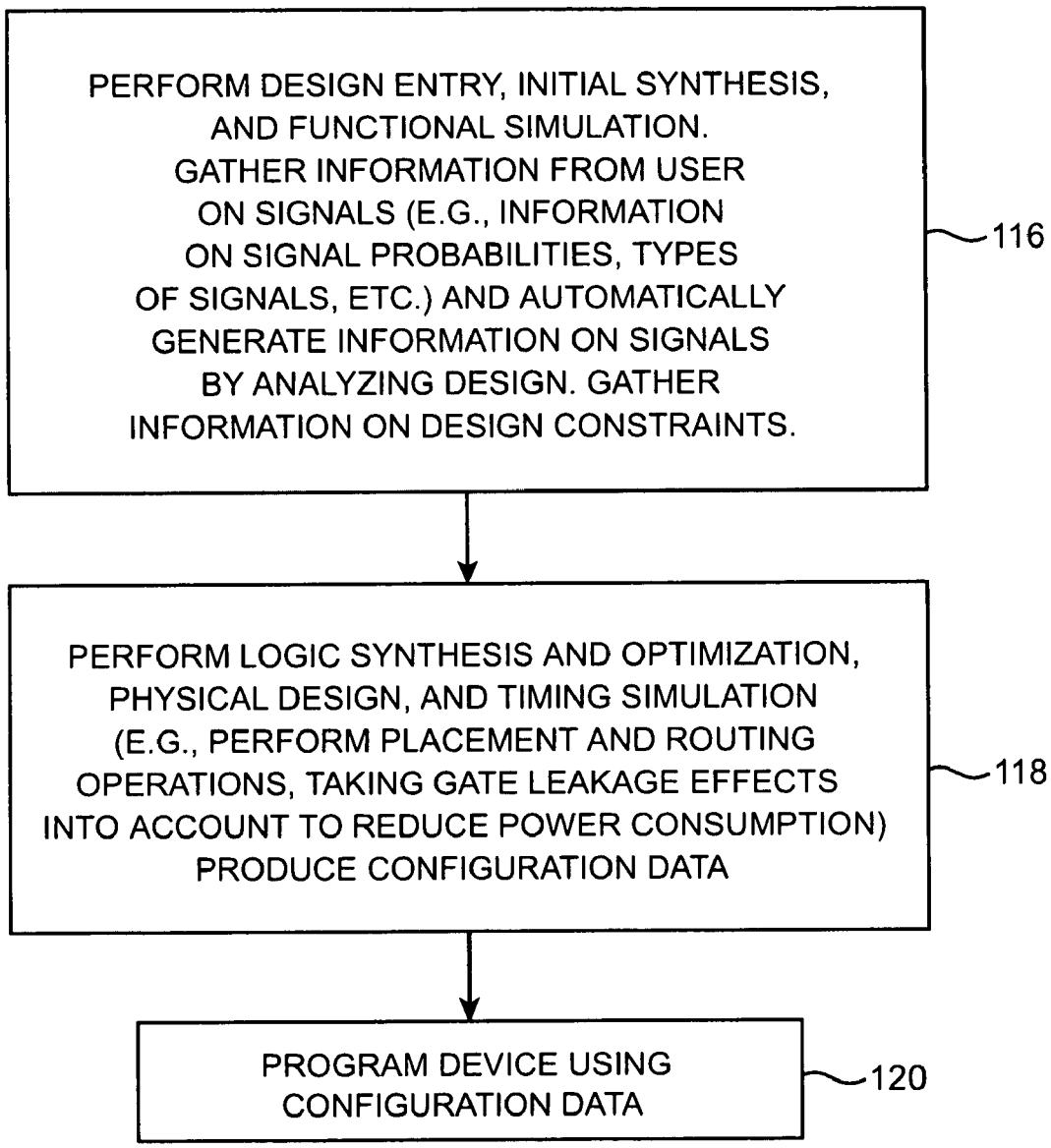
FIG. 16 is a flow chart of illustrative steps involved in designing and programming a programmable logic device while taking account of gate leakage effects in accordance with the present invention.

Illustrative steps involved in using tools 100 in designing a circuit for a programmable logic device are shown in FIG. 16. At step 116, tools such as design entry tools 102, initial synthesis tools 104, and functional simulation tools 106 may be used for design entry, initial synthesis, and functional simulation. During step 116, information on the signals used in the logic designer's logic design may be gathered from the logic designer and may be automatically generated. Information may be gathered from the logic designer by allowing the logic designer to incorporate signal information into the design using appropriate high-level logic design specification languages, by accepting input from a logic designer in response to on-screen options or prompts, or using any other suitable input technique. Information may be gathered on the probability (or estimated probability) for each logic signal to be high or low. Information on signal type (enable, disable, clock, control, data, alarm, etc.) and/or other known or predicted signal characteristics may also be gathered. Signal information may be generated automatically by the CAD tools by analyzing the design.

The CAD tools 100 produce an implementation of a desired logic design in a given programmable logic device. In addition to the constraints on the design that are imposed by the limited resources of the programmable logic device, the design implementation is constrained by other factors, such as the desired level of performance of the device, the desired powers consumption level, etc. Information on these additional constraints may be provided to CAD tools 100 during step 116.

At step 118, logic synthesis and optimization, physical design, and timing simulation operations may be performed using tools such as logic synthesis and optimization tools 108, placement and routing tools 110, and timing simulation tools 114. Gate leakage current optimizer 112 may be used during step 118 (or step 116) to ensure that power consumption due to gate leakage effects are taken into account during these operations. For example, tools 100 may use leakage current optimizer 112 to produce configuration data for the programmable logic device that, when used to program the device, will cause the signals that are always high or more frequently high to be handled by transistors that are higher in the logic gate stacks of the device and will cause the signals that are always or more frequently low to be handled by transistors that are lower in the logic gate stacks. By allocating device resources so that the transistors that are most able to handle high signals without experiencing undue gate leakage power consumption receive the high signals, power consumption due to gate leakage can be made as low as possible while satisfying device performance criteria.

During steps 116 and 118, tools 100 can balance performance criteria against other criteria such as power consumption criteria. In resolving conflicts between various design constraints, the tools 100 can make tradeoffs (e.g., performance versus power consumption). Tradeoffs can be made based on criteria provided by the logic designer (e.g., during step 116) or can be made based on predefined criteria (e.g., criteria built into tools 100).

After the desired logic design has been satisfactorily tested at step 118, the tools 100 of the logic design system 44 can produce configuration data for programming the programmable logic device. The programmable logic device can be provided with the configuration data at step 120. The configuration data configures the programmable logic device to perform the desired custom logic function of the logic designer. Because tools such as leakage current optimizer 112 were used in producing the implementation of the desired design, the configuration data will configure the logic device in a way that routes signals to positions in logic gate stacks based on the amount that these signals are high or low. This reduces and/or minimizes power consumption due to gate leakage effects.

The CAD tools 100 of FIG. 15 are merely illustrative. Logic design systems that produce configuration data for programmable logic devices based on high-level logic designs can be implemented using any suitable suite of design tools. The functions of gate leakage optimizer 112 may be implemented in one or more of such tools. Implementation of these functions as part of placement and routing tools 110 is merely illustrative. Moreover, the steps of FIG. 16 are illustrative. Other suitable processes may be used by the logic design system 44 to create programmable logic device configuration data that will reduce power consumption due to gate leakage effects if desired.

The foregoing is merely illustrative of the principles of this invention and various modifications can be made by those skilled in the art without departing from the scope and spirit of the invention.

What is claimed is:

1. A method for using a logic design system to implement a logic design in a programmable logic device, comprising:
    using the logic design system to allow a logic designer to specify a desired logic design; and
    generating configuration data for the programmable logic device using the logic design system that takes into account power consumption due to gate leakage effects, wherein the programmable logic device includes logic gates having stacks of transistors, the method further comprising using the logic design system to produce configuration data for the programmable logic device that configures the programmable logic device to route signals on the programmable logic device to positions within the stacks based on amounts that the signals are expected to be high or low.

2. The method defined in claim 1 further comprising using the logic design system to gather information on the signals from the logic designer.

3. The method defined in claim 1 further comprising analyzing the logic design with the logic design system to automatically generate information on the signals.

4. The method defined in claim 1 further comprising using the logic design system to produce configuration data that helps to reduce power consumption due to gate leakage effects in the programmable logic device by configuring the programmable logic device so that the signals that are handled by transistors that are higher in the stacks are more likely to be high than signals that are handled by transistors that are lower in the stacks.

5. A method for using a logic design system to minimize power consumption in a programmable logic device, comprising:
    using the logic design system to receive a desired logic design from a logic designer; and
    producing configuration data for the programmable logic device with the logic design system that, when programmed into the programmable logic device, implements the desired logic design in the programmable logic device while routing signals on the programmable logic device to reduce power consumption due to gate leakage effects, wherein the programmable logic device includes logic gates having stacks of transistors with transistor gates and wherein producing the configuration data comprises producing configuration data that ensures that signals that are more likely to be high are routed to the transistor gates of the transistors higher in the stacks and that signals that are less likely to be high are routed to the transistor gates of the transistors lower in the stacks.

6. The method defined in claim 5 further comprising using the logic design system to receive a plurality of logic design constraints from the logic designer, wherein one of the constraints involves minimizing power consumption due to gate leakage effects and wherein producing the configuration data comprises producing configuration data that balances the plurality of constraints.

7. The method defined in claim 5 wherein the programmable logic device includes at least one logic gate having a stack of transistors with transistor gates, wherein a first one of the transistors is higher in the stack than a second one of the transistors, and wherein first and second signals are received by the transistor gates, wherein the first signal is high more often than the second signal, and wherein producing the configuration data comprises producing configuration data that, when programmed into the programmable logic device, causes the first signal to be received by the first transistor gate and the second signal to be received by the second transistor gate to reduce power consumption due to gate leakage.

8. The method defined in claim 7 further comprising using the logic design system to receive information on the first and second signals from the logic designer, wherein the information on the first and second signals includes information that the first signal is high more often that the second signal.

9. The method defined in claim 7 further comprising using the logic design system to automatically analyze the logic design to produce information that the first signal is high more often than the second signal.

10. The method defined in claim 5 further comprising:
    using the logic design system to gather signal type information from the logic designer; and
    using the signal type information to determine how to route signals on the programmable logic device to minimize power consumption due to gate leakage.

* * * * *